US006802918B1

(12) United States Patent
Hughes et al.

(10) Patent No.: US 6,802,918 B1
(45) Date of Patent: Oct. 12, 2004

(54) FABRICATION METHOD FOR ADHESIVE PRESSURE BONDING TWO COMPONENTS TOGETHER WITH CLOSED-LOOP CONTROL

(75) Inventors: Gary B. Hughes, Santa Barbara, CA (US); James P. McDonald, Solvang, CA (US); Arthur V. Schweidler, Solvang, CA (US); Lloyd D. Ingle, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 229 days.

(21) Appl. No.: 09/853,125

(22) Filed: May 9, 2001

(51) Int. Cl.[7] ............................................. B32B 31/20
(52) U.S. Cl. ..................... 156/64; 156/102; 156/298; 29/832; 29/739; 438/118
(58) Field of Search ................................. 156/102, 298, 156/64, 358, 360, 367, 368, 378, 379, 299; 29/832, 739, 740; 438/118

(56) References Cited

U.S. PATENT DOCUMENTS

| | | | | |
|---|---|---|---|---|
| 5,234,530 A | * | 8/1993 | Freeman, III | .............. 156/358 |
| 5,460,677 A | * | 10/1995 | Inasaka | .................... 156/174 |
| 5,842,273 A | * | 12/1998 | Schar | ............................ 29/830 |
| 5,849,132 A | * | 12/1998 | Chiu | ........................... 156/298 |
| 5,887,343 A | * | 3/1999 | Salatino et al. | ............... 29/833 |
| 5,985,064 A | * | 11/1999 | Sato | ............................. 156/64 |
| 6,197,139 B1 | | 3/2001 | Ju et al. | |
| 6,198,100 B1 | | 3/2001 | Eden et al. | |
| 6,423,172 B1 | * | 7/2002 | McArdle et al. | ......... 156/272.2 |

* cited by examiner

Primary Examiner—Richard Crispino
Assistant Examiner—George R. Koch, III
(74) Attorney, Agent, or Firm—William C. Schubert

(57) ABSTRACT

Two components are bonded together in a bonding apparatus using a bonding medium of malleable metallic spheres and a curable adhesive. The two components are bonded by positioning the components in a facing-but-spaced-apart relation in the bonding apparatus with the spheres and the adhesive between the first component and the second component. The bonding apparatus forces the first component toward the second component with sufficient force to bond the spheres to the first component and to the second component, while monitoring at least one measured bonding reaction of the first component and the second component, and controlling the bonding apparatus responsive to the step of monitoring. The adhesive is thereafter cured, optionally with the bonding pressure released and the assembly removed from the bonding apparatus.

20 Claims, 3 Drawing Sheets

FABRICATION METHOD FOR ADHESIVE PRESSURE BONDING TWO COMPONENTS TOGETHER WITH CLOSED-LOOP CONTROL

This invention relates to the pressure bonding of two components together with a curable adhesive and malleable metal spheres, and more particularly to such bonding where one or both of the components are fragile.

BACKGROUND OF THE INVENTION

In one form of an infrared sensor device, a sensor chip assembly (SCA) is bonded to the mounting platform of a cryostat to form a bonded assembly. The sensor chip assembly is the active sensor component, and the cryostat is supported on an aiming structure such as a gimbal. The detector plane of the sensor chip assembly must be aligned extremely precisely with respect to a reference datum plane, to ensure that the sensor chip assembly is pointed in the proper direction by the aiming structure during service. In some designs, alignments must be achieved between the two planes on the order of 10 arcseconds or better.

The sensor chip assembly is a microelectronic device which includes a detector and a readout that are fabricated by microelectronic techniques, and then joined together. The sensor chip assembly is a relatively fragile structure that may be easily damaged by even relatively small forces that exceed its load limit. Such damage may include mechanical cracking or breaking, or the damage may be more subtle in the form of a degradation in electrical performance without cracking or breaking. The mounting platform to which the sensor chip assembly is bonded usually is a more-robust mechanical structure.

To accomplish the bonding, the sensor chip assembly and the mounting platform are carefully aligned in a bonding apparatus. The bonding apparatus is an ultra-high-precision device which is custom adjusted for each bonded assembly to account for small structural variations that would otherwise result in an unacceptable misalignment of the sensor chip assembly and the reference datum plane in the absence of care taken to ensure proper alignment. Current practice involves dispensing a quantity of curable adhesive between the sensor chip assembly and the mounting platform, and the two components are pressed together and constrained in place by the bonding apparatus until the adhesive is cured.

The bonding apparatus is used to maintain the correct alignment until the adhesive cures sufficiently past the stage at which it may creep and deform during curing, which may require several hours. The alignment must be forcefully maintained because, if the bonded structure were removed from the bonding apparatus too early and before curing is complete, the slight shape change of the adhesive during curing could produce a misalignment between the sensor chip assembly and the reference datum plane that would be unacceptable. The bonding apparatus provides sufficient constraint during curing of the adhesive and prevents such shape change and misalignment.

While this approach is operable and works well in a laboratory setting, it is uneconomical in a production operation. In production, the precision bonding apparatus is tied up with each individual assembly for an excessively long time by the need to prevent movement of the sensor chip assembly until the adhesive cures sufficiently, which may be several hours. The bonding apparatus is quite expensive, and it is therefore not possible to supply a large number of them consistent with the production requirement to fabricate a large number of the bonded assemblies. There is therefore a need for an approach that produces the required alignment of the bonded components in the assembly, but which is more suitable for a production operation. The present invention fulfills this need, and further provides related advantages.

SUMMARY OF THE INVENTION

The present invention provides a method for fabricating a structure from two (or more) components. It is particularly useful when one or more of the components is relatively fragile, as in the case where one of the components is a microelectronic device such as a sensor chip assembly. Damage to such fragile components is avoided by carefully controlling the loads applied to the structure during the bonding operation. The present approach is highly reproducible and does not require the judgments of a skilled technician during the bonding operation.

In accordance with the invention, a fabrication method comprises the steps of providing a first component and a second component, positioning the first component in facing-but-spaced apart relation to the second component, and placing a bonding medium between the first component and the second component. The bonding medium comprises at least two malleable spheres made of a metal that bonds to both the first component and to the second component when subjected to a sufficiently large force, and a quantity of an uncured adhesive. The first and second components may be of any operable types. In a case of interest, the first component is a sensor chip assembly. The second component may be a mounting platform. A preferred metal for use in the spheres is malleable indium metal.

The method further includes bonding the first component to the second component using the bonding medium by supplying a bonding apparatus having at least one force actuator. The bonding apparatus presses the first component against the second component in a facing-but-spaced-apart relation, with the bonding medium therebetween and with a sufficient bonding force to bond the malleable spheres both to the first component and to the second component. There may be at least two independently controllable force actuators, or a single force actuator may be used. Simultaneously with the pressing, at least one measured bonding reaction of the first component and the second component is monitored, and the force actuators of the bonding apparatus are controlled responsive to the step of monitoring. The adhesive is thereafter cured.

In one particularly preferred embodiment, the steps of placing and the bonding apparatus pressing are performed cooperatively by positioning the first component and the second component in a facing relationship in the bonding apparatus, dispensing the uncured adhesive between the first component and the second component, positioning the spheres in the adhesive, bringing the first component, the second component, and the spheres into touching contact with each other, and forcing the first component toward the second component with sufficient force to bond the spheres to the first component and to the second component.

In the basic process, the step of controlling preferably includes the steps of providing a set of bonding reaction limitations, comparing the measured bonding reactions with the respective set of bonding reaction limitations, and sending control signals to the at least one force actuator responsive to the step of comparing. The step of providing a set of bonding reaction limitations preferably includes evaluating a set of stresses that cause damage to the first component, and selecting the set of bonding reaction limitations responsive to the step of evaluating the set of stresses. The bonding apparatus loading may otherwise be conducted according to a preselected load profile. The step of controlling may also include the step of determining a set of maximum stresses applied to the first component.

In the preferred processing, the step of curing the adhesive includes the step of removing the bonding force prior to completion of full curing of the adhesive. That is, the bonding spheres are placed in the adhesive, and the bonding apparatus is used to force the components together into their final aligned positions. The bonded structure is thereafter removed from the bonding apparatus and set aside to allow the adhesive to cure. The components are held together in the desired position and orientation by the adhesion of the malleable spheres to the components until the adhesive fully cures, avoiding the need to keep the components in the bonding apparatus until the adhesive is cured. The spheres rather than the bonding apparatus provide the necessary constraint during the remainder of the curing process. Process throughput is greatly increased, reducing the manufacturing costs for the product.

The use of malleable metals and adhesives between electronic components is known in other contexts, such as in the bonding of an infrared detector to a readout integrated circuit in a hybridization or "flip chip" using deformable metallic bumps. However, the malleable metals are not employed in a bonding operation like that of the present approach, where they constrain the deformation of the adhesive during curing. That is, in these other approaches an uncured adhesive is not applied prior to the bonding operation, and the bumps do not serve to constrain the adhesive during the curing of the adhesive.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
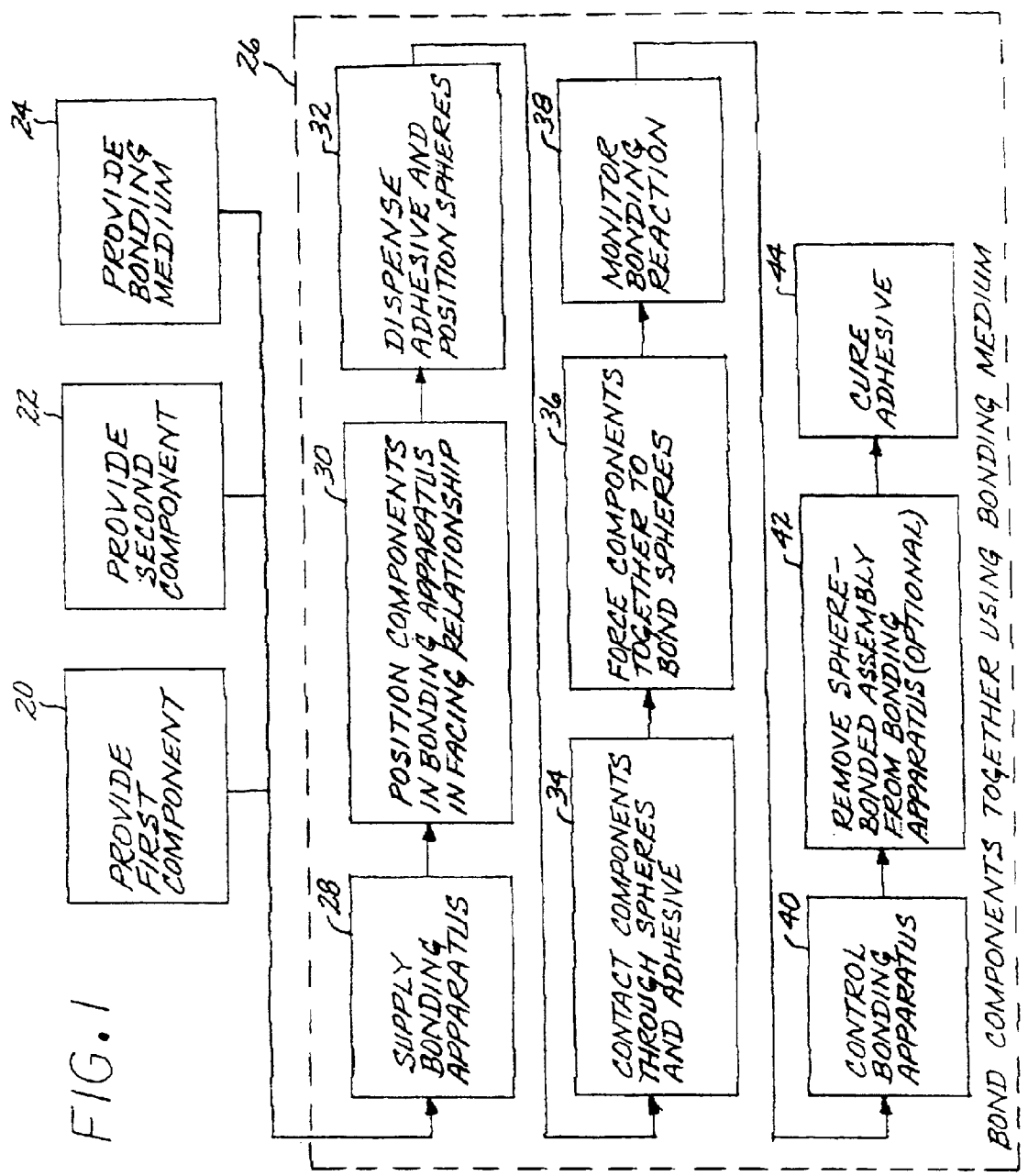
FIG. 1 is a block flow diagram of a fabrication method.

FIG. 1 depicts a fabrication method for bonding together two components using a bonding medium. A first component is provided, numeral 20, and a second component is provided, numeral 22. A bonding medium is provided, numeral 24. The bonding medium comprises at least two, and preferably at least three, malleable spheres made of a malleable metal that bonds to both the first component and to the second component when subjected to a sufficiently large force, and a quantity of an uncured adhesive.

The first component is bonded to the second component using the bonding medium, numeral 26. The bonding step 26 includes supplying a bonding apparatus having at least one force actuator, numeral 28, and positioning the first component and the second component in the bonding apparatus in a facing-but-spaced-apart relation without the bonding medium present, numeral 30.

Figure 2:
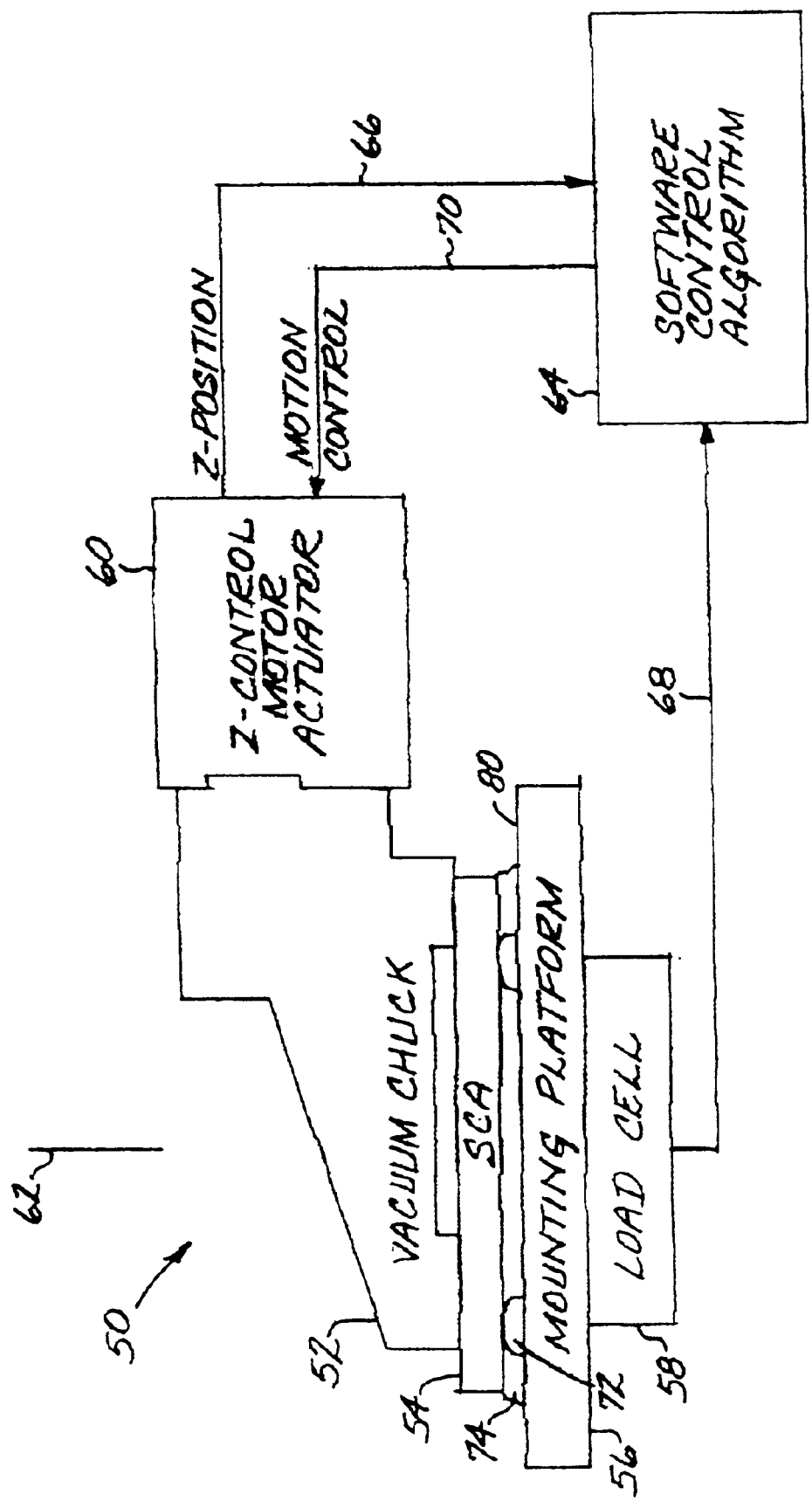
FIG. 2 is a schematic elevational view of a bonding apparatus.

FIG. 2 schematically illustrates the bonding apparatus 50 having a vacuum chuck 52 that holds one of the two components, here the first component 54. The second component 56 is supported on a load cell 58, preferably with an upper face 80 of the second component 56 lying in a horizontal plane. An actuator 60, in this case a stepper motor, moves the vacuum chuck 52 and thence the first component 54 parallel to a Z-axis 62. There may optionally be multiple actuators that independently move different portions of the first component 54 or that move the second component 56. A controller 64 receives a Z-position signal 66 from the actuator 60 and a load signal 68 from the load cell 58, and sends a motion control command 70 to the actuator 60. The controller 64 includes a microprocessor which receives the signals 66 and 68, sends the command 70, and performs calculations by which the command 70 is derived from the signals 66 and 68 and other information as discussed below.

In the preferred case, the first component 54 is a sensor chip assembly (SCA) of an infrared detector system, and the second component 56 is the mounting platform of a cryogenic Dewar to which the sensor chip assembly 54 is mounted. The sensor chip assembly typically includes a detector chip and a readout integrated circuit. One or both of these elements of the sensor chip assembly is mechanically and electronically fragile. Even relatively small forces of about 1 kilogram or less applied to the sensor chip assembly may cause it to fracture or, if not fracture, to stress and strain in a manner that causes it to perform in an unsatisfactory manner during subsequent service. The magnitudes of the stresses and strains that cause damage are known for the sensor chip assembly from independent studies of the effects of various types of stresses and strains on the mechanical integrity and electrical performance of the sensor chip assembly. The present approach is particularly advantageous for bonding such fragile components, because it monitors the bonding forces and controls the bonding process responsively so that the forces applied are below the limits that cause damage to the components being bonded.

In this preferred case of the bonding of the sensor chip assembly first component 54 and the mounting platform second component 56, the components 54 and 56 must be aligned with each other very precisely, so that the detector plane of the sensor chip assembly is aligned to a reference datum plane to within about 10 arcseconds. The vacuum chuck 52 is mounted to a support structure (not shown) that facilitates the precise alignment. The precise alignment must be maintained in the final bonded structure.

Figure 3:
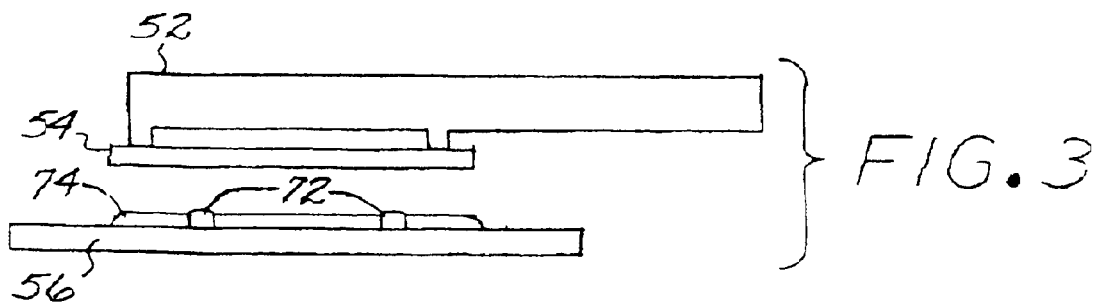
FIGS. 3–6 are a series of schematic elevational views of the bonding apparatus and components during the bonding operation.

Returning to the discussion of FIG. 1, the bonding medium is positioned on the upper face 80 of the second component 56. The bonding medium includes two or more malleable spheres 72 positioned between the first component 54 and the second component 56. For the present applications, the malleable spheres are preferably metal, most preferably indium metal. Other malleable metals such as tin, germanium, gold, and the like may be used instead of indium. As used herein, the term "sphere" is a term of art referring to a metallic mass that connects two microelectronic structures mechanically and in some cases electrically. The use of the term "sphere" does not imply any particular shape and specifically does not require a spherical shape. The "sphere" may initially be of any operable shape, but in the presently preferred approach the sphere 72 is initially a roughly spherical mass of the metal that is deformed and flattened during the subsequent bonding. The bonding medium further includes an adhesive layer 74 that is also present between the first component 54 and the second component 56. Any operable adhesive may be used, but a preferred adhesive is an epoxy-based adhesive. To apply the bonding medium, a quantity of the adhesive layer 74 is dispensed onto the upper face 80, and then the spheres 72 are dropped into the adhesive, numeral 32. FIG. 3 illustrates the elements at this stage.

The first component 54 and the spheres 72 are thereafter brought into touching contact with each other, and the second component 56 and the spheres 72 are brought into touching contact with each other, numeral 34. (Equivalently, the spheres could be positioned between the first component and the second component in light but unbonded contact to each one, and the uncured adhesive dispensed into the remaining space between the first component and the second component. This alternative is not preferred, because typically the viscosity of the uncured adhesive is too high to flow easily into the space between the first component and the second component.) Because the spheres 72 are already resting on the upper face 80 of the second component 56 after step 32, this touching contact is accomplished by lowering the first component 54 (held in the vacuum chuck 52) using the actuator 60 until it just touches the spheres 72 and gently forcing them into full contact with the upper face 80.

Figure 4:
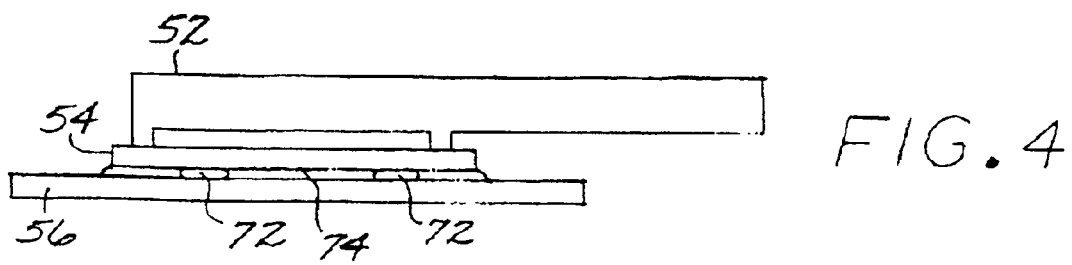

The bonding apparatus forces the first component 54 toward the second component 56 with a sufficient bonding force to bond the spheres 72 to the first component 54 and to the second component 56, numeral 36. In the preferred case, the facing surface of the sensor chip assembly first component 54 is silicon, and the facing surface of the mounting platform second component 56 is a ceramic. The spheres are preferably indium, which deforms and flattens under the applied bonding force and, upon reaching a sufficiently high bonding pressure of about 50 grams, cold welds to the first component 54 and to the second component 56. FIG. 4 illustrates the elements at this stage.

During this step 36 and simultaneously therewith, the controller 64 monitors at least one measured bonding reaction of the first component 54 and the second component 56 as measured by the load cell 58, as the load signal 68, numeral 38. The bonding reaction may be an axial load, such as the Z-axis force $F_z$ measured by the load cell 58 and applied parallel to the Z-axis 62. Transverse forces perpendicular to the axis 62 and torques may be measured as well and provided to the controller 64.

The controller 64 controls the bonding apparatus 50 responsive to the step of monitoring 38, numeral 40. The steps of forcing 36, monitoring 38, and controlling 40 are performed simultaneously. The step of controlling 40 preferably includes providing a set of bonding reaction limitations for the components 54 and/or 56, such as the stress and strain limitations discussed earlier. Such limitations are determined separately by performing studies of the magnitudes of stresses and strains that cannot be exceeded without damaging the components, in this case the sensor chip assembly first component 54. The measured bonding reactions of step 38 are compared with the respective set of bonding reaction limitations, and control signals are sent to the actuator 60 responsive to the step of comparing. Thus, for example, it may be determined that the axial force $F_z$ applied parallel to the Z-axis 62 may not exceed a value $F_{z,max}$ (the bonding reaction limitation for this case) without causing damage to the sensor chip assembly. The actuator 60 is controlled so as not to exceed this value of axial force. In other cases, the actual loading situation may be more complex, and combinations of internal stresses and strains within the components may be taken into account in determining how much axial force may be applied by the actuator 60, and the actuator control command 70 is selected responsively. For example, strain gauges may be applied to the first component 54, and their outputs provided to the controller 64. The controller 64 makes the calculations of internal stresses and strains from the applied forces by conventional mechanical analysis techniques such as stress-strain data and a regression curve obtained by fitting a curve to the data.

The bonding apparatus actuator loading of step 36 may be conducted initially according to a preselected load profile as a function of time. However, the application of the load according to this load profile is typically modified responsive to the steps 38 and 40. That is, if the preselected load profile is producing too high a loading in the fragile component(s), then the rate of load application may be slowed or halted to permit the indium to flow to lessen the rate of increase of the stresses and strains in the component(s).

Figure 5:
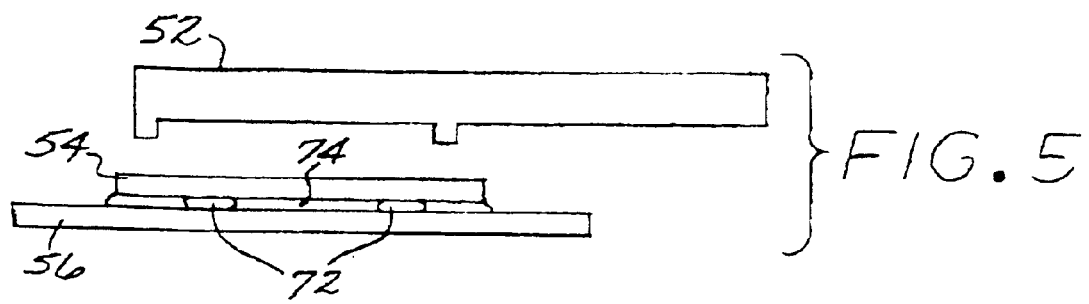
Figure 6:
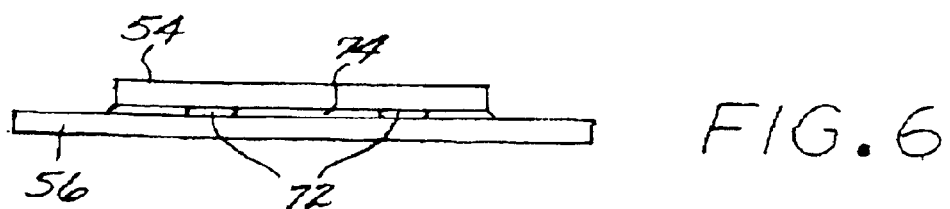

During the steps 36, 38, and 40, the adhesive 74 begins to cure. Full curing takes a good deal of time beyond the extent of these steps 36, 38, and 40, however. Therefore optionally but preferably, the bonding force and constraint applied by the actuator 60 are removed prior to completion of full curing of the adhesive 74, numeral 42, as seen in FIG. 5. The assembly of components 54 and 56 with the bonding medium of spheres 72 and adhesive 74 is removed from the bonding apparatus 50 and set aside to allow the adhesive to fully cure, numeral 44 and FIG. 6. In the prior approach, curing was accomplished with the assembly remaining in the bonding apparatus 50, but this ties up the expensive bonding apparatus for an extended period of time, typically about 24 hours with adhesives of interest, and is impractical for production operations.

The spheres 72 which are adhered to the components 54 and 56 hold the components 54 and 56 in exactly the correct orientation and separation while the adhesive 74 is curing in step 44. If the spheres were not present to serve as the constraint against deformation, the adhesive 74 would deform slightly as it cures. The experience of the inventors has shown that even this slight deformation is sufficient to result in an unacceptably large misalignment of the sensor chip assembly first component 54 with the reference datum plane. The use of the spheres 72 therefore holds the components 54 and 56 in the correct orientation and position during the curing of the adhesive 74, while permitting the curing assembly to be removed from the bonding apparatus 50 for reasons of process economics.

The feedback control of bonding force applied by the actuator 60 practiced during steps 36, 38, and 40 is necessary in order to use this bonding approach utilizing a bonding medium of spheres 72 and adhesive 74. The presence of the spheres 72 and their resulting concentrated force loading on the components can produce damage in the sensor chip assembly first component 54 unless great care is taken during force application by the actuator 60 not to exceed the bonding reaction limitations and the maximum permissible stresses and strains within the component(s). The feedback control of steps 36, 38, and 40 provides this careful force application.

The present invention was reduced to practice using the bonding apparatus 50 like that of FIG. 2, and the fabrication approach of FIG. 1. Five assemblies of sensor chip assembly first component 54 and mounting platform second component 56 were prepared using this apparatus. The controller 64 was programmed so that $F_{z,max}$ was established at 120 grams (the bonding reaction limitation in this case) for the geometry used. The four bonding spheres 72 were initially indium spheres of diameter 0.010 inch, and the final desired result was a spacing between the first component 54 and the second component 56 of 0.005 inch (that is, with the height of the spheres reduced to half their initial diameter). During the sphere-bonding operation of steps 36, 38, and 40, the actuator 60 was moved at a constant rate until $F_z$ exceeded 120 grams, at which time the movement was halted, and the spheres 72 were allowed to flow under the applied force until $F_z$ fell to a relief force of below 120 grams, in this case 105 grams. The compressive motion of the actuator 60 was then resumed. This loading and relieving cycle was automatically repeated several times until the final thickness of 0.005 inch was reached. Step 42 was included in this processing, so that the assemblies were removed prior to complete curing, after a pressing time in the bonding apparatus of about 1 minute, and set aside to complete the curing for a total curing time of about 24 hours. The bonding apparatus was therefore immediately available to bond other assemblies in a production operation.

As a result of the feedback control of the actuator 60, no damage was produced in the sensor chip assembly first component 54, as determined by visual inspection for cracking and electrical tests of operability. The sensor chip assembly first component 54 and the mounting platform second component 56 were aligned within 10 arcseconds in the final article with cured adhesive.

Comparative testing was performed. In one type of comparative test, the bonding operation was repeated without the use of the spheres and with only adhesive bonding the components together. After removal of the partially bonded components from the bonding apparatus, there was a post-alignment creep deformation of the adhesive during curing that resulted in misalignments of tens of arc minutes, which is unacceptable for the sensor application of interest. This test demonstrated that, absent the use of the spheres, the components must remain in the bonding apparatus to constrain such post-alignment creep deformation for up to about 24 hours, preventing the use of the bonding apparatus in bonding other components for that period. The use of the spheres is therefore necessary to facilitate the production bonding operation.

In a second type of comparative test, twelve assemblies of sensor chip assembly and mounting platform were prepared using a human-controlled apparatus which was otherwise like the apparatus of FIG. 2. The bonding medium included the spheres and the adhesive. The testing demonstrated that even a skilled human operator did not react sufficiently quickly to avoid damage to the sensor chip assemblies as the load varied at about the bonding load. Every one of the twelve manually produced assemblies cracked or otherwise suffered damage by the inability of the human operator to compensate for stress or strain buildups in the fragile sensor chip assembly first component 54. That is, the cooperative use of the spheres 72 and adhesive 74, which are necessary for an acceptable production rate, also requires the use of the computer feedback-controlled bonding apparatus 50.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A fabrication method comprising the steps of
providing a first component and a second component;
positioning the first component in facing-but-spaced apart relation to the second component;
placing a bonding medium between the first component and the second component, the bonding medium comprising
at least two malleable spheres made of a metal that bonds to both the first component and to the second component when subjected to a sufficiently large force, and
a quantity of an uncured adhesive; thereafter
bonding the first component to the second component using the bonding medium, the step of bonding including the steps of
supplying a bonding apparatus having at least one force actuator;
the bonding apparatus pressing the first component against the second component in a facing-but-spaced-apart relation, with the bonding medium therebetween, with a sufficient bonding force to bond the malleable spheres both to the first component and to the second component, simultaneously
monitoring at least one measured bonding reaction of the first component and the second component, and simultaneously
controlling the bonding apparatus responsive to the step of monitoring, and thereafter
curing the adhesive.

2. The method of claim 1, wherein the step of controlling includes the steps of
providing a set of bonding reaction limitations,
comparing the at least one measured bonding reaction with the respective set of bonding reaction limitations, and
sending control signals to the at least one force actuator responsive to the step of comparing.

3. The method of claim 2, wherein the step of providing a set of bonding reaction limitations includes the steps of
evaluating a set of stresses that cause damage to the first component, and
selecting the set of bonding reaction limitations responsive to the step of evaluating the set of stresses.

4. The method of claim 1, wherein the steps of placing and the bonding apparatus pressing include the steps of
positioning the first component and the second component in a facing relationship in the bonding apparatus,
dispensing the adhesive between the first component and the second component,
positioning the spheres in the adhesive,
bringing the first component and the spheres, and the second component and the spheres, into touching contact with each other, and
forcing the first component toward the second component with sufficient force to bond the spheres to the first component and to the second component.

5. The method of claim 1, wherein the step of controlling includes the step of
determining a set of maximum stresses applied to the first component.

6. The method of claim 1, wherein the step of providing a first component and a second component includes the steps of
providing a sensor chip assembly as the first component.

7. The method of claim 1, wherein the step of providing a first component and a second component includes the steps of
providing a sensor chip assembly as the first component, and
providing a mounting platform as the second component.

8. The method of claim 1, wherein the step of the bonding apparatus pressing includes the step of
the bonding apparatus loading according to a preselected load profile.

9. The method of claim 1, wherein the step of placing a bonding medium includes the step of
furnishing spheres comprising a metal selected from the group consisting of indium, tin, germanium, and gold.

10. The method of claim 1, wherein the step of curing the adhesive includes the step of
removing the bonding force prior to completion of full curing of the adhesive.

11. A fabrication method comprising the steps of
providing a first component and a second component;
providing a bonding medium comprising
at least two malleable spheres made of a metal that bonds to both the first component and to the second component when subjected to a sufficiently large force, and
a quantity of an uncured adhesive;
bonding the first component to the second component using the bonding medium, the step of bonding including the steps of
supplying a bonding apparatus having at least one force actuator,
positioning the first component and the second component in a facing relationship to each other in the bonding apparatus,
dispensing the adhesive between the first component and the second component,
positioning the spheres in the adhesive, thereafter
bringing the fist component, the second component, and the spheres into touching contact with each other,
the bonding apparatus forcing the first component toward the second component with sufficient force to bond the spheres to the first component and to the second component to form an assembly,
monitoring at least one measured bonding reaction of the first component and the second component,
controlling the bonding apparatus responsive to the step of monitoring, the steps of forcing, monitoring, and controlling being performed simultaneously, and thereafter
curing the adhesive.

12. The method of claim 11, wherein the step of controlling includes the step of
providing a set of bonding reaction limitations,
comparing the measured bonding reactions with the respective set of bonding reaction limitations, and
sending control signals to the at least one force actuator responsive to the step of comparing.

13. The method of claim 12, wherein the step of providing a set of bonding reaction limitations includes a step of
evaluating a set of stresses that cause damage to the first component, and
selecting the set of bonding reaction limitations responsive to the step of evaluating the set of stresses.

14. The method of claim 11, wherein the step of controlling includes the step of
determining a set of maximum stresses applied to the first component.

15. The method of claim 11, wherein the step of providing a first component and a second component includes the steps of
providing a sensor chip assembly as the first component.

16. The method of claim 11, wherein the step of providing a first component and a second component includes the steps of
providing a sensor chip assembly as the first component, and
providing a mounting platform as the second component.

17. The method of claim 11, wherein the step of the bonding apparatus pressing includes the step of
the bonding apparatus loading according to a preselected load profile.

18. The method of claim 11, wherein the step of placing a bonding medium includes the steps of
furnishing spheres comprising a metal selected from the group consisting of indium, tin, germanium, and gold.

19. The method of claim 11, wherein the step of curing the adhesive includes the step of
removing the bonding force prior to completion of full curing of the adhesive, and
removing the assembly from the bonding apparatus.

20. A fabrication method comprising the steps of
providing a sensor chip assembly and a mounting platform;
positioning the sensor chip assembly in facing-but-spaced apart relation to the mounting platform;
placing a bonding medium between the sensor chip assembly and the mounting platform, the bonding medium comprising
at least two malleable spheres made of a metal selected from the consisting of indium, tin, germanium, and gold, and
a quantity of an uncured adhesive;
bonding the sensor chip assembly to the mounting platform using the bonding medium, the step of bonding including the steps of
supplying a bonding apparatus having a force actuator;
the bonding apparatus pressing the sensor chip assembly against the mounting platform, with the bonding medium therebetween, with a sufficient bonding force to bond the malleable spheres both to the sensor chip assembly and to the mounting platform to form an assembly, simultaneously
monitoring at least one measured bonding reaction of the sensor chip assembly and the mounting platform, and simultaneously
controlling the bonding apparatus responsive to the step of monitoring, and thereafter
curing the adhesive, the step of curing the adhesive including the steps of
removing the bonding force prior to completion of full curing of the adhesive, and
removing the assembly from the bonding apparatus prior to full curing of the adhesive.

* * * * *